United States Patent
Kikuchi et al.

(10) Patent No.: US 10,978,300 B2
(45) Date of Patent: *Apr. 13, 2021

(54) METHODS TO REDUCE GOUGING FOR CORE REMOVAL PROCESSES USING THERMAL DECOMPOSITION MATERIALS

(71) Applicant: Tokyo Electron Limited, Tokyo (JP)

(72) Inventors: Yuki Kikuchi, Albany, NY (US); Toshiharu Wada, Albany, NY (US); Kaoru Maekawa, Albany, NY (US); Akiteru Ko, Albany, NY (US)

(73) Assignee: TOKYO ELECTRON LIMITED, Tokyo (JP)

(*) Notice: Subject to any disclaimer, the term of this patent is extended or adjusted under 35 U.S.C. 154(b) by 0 days.

This patent is subject to a terminal disclaimer.

(21) Appl. No.: 16/507,821

(22) Filed: Jul. 10, 2019

(65) Prior Publication Data

US 2020/0020523 A1    Jan. 16, 2020

Related U.S. Application Data

(60) Provisional application No. 62/696,692, filed on Jul. 11, 2018, provisional application No. 62/729,145, filed on Sep. 10, 2018.

(51) Int. Cl.
  *H01L 21/02* (2006.01)
  *H01L 21/027* (2006.01)
  (Continued)

(52) U.S. Cl.
  CPC ........ *H01L 21/0262* (2013.01); *H01L 21/027* (2013.01); *H01L 21/02271* (2013.01);
  (Continued)

(58) Field of Classification Search
  None
  See application file for complete search history.

(56) References Cited

U.S. PATENT DOCUMENTS 8,871,651 B1 * 10/2014 Choi ................ H01L 29/66795
                                                        216/12
2008/0038467 A1    2/2008 Jagannathan et al.
(Continued)

OTHER PUBLICATIONS

International Search Report and Written Opinion for PCT/US2019/041193 dated Oct. 30, 2019, 9 pages.

*Primary Examiner* — Stephanie P Duclair
(74) *Attorney, Agent, or Firm* — Rothwell, Figg, Ernst & Manbeck, P.C.

(57) ABSTRACT

Embodiments are disclosed that reduce gouging during multi-patterning processes using thermal decomposition materials. For one embodiment, gouging is reduced or suppressed by using thermal decomposition materials as cores during multiple patterning processes. For one embodiment, gouging is reduced or suppressed by using thermal decomposition materials as a gap fill material during multiple patterning processes. By using thermal decomposition material, gouging of an underlying layer, such as a hard mask layer, can be reduced or suppressed for patterned structures being formed using the self-aligned multi-patterning processes because more destructive etch processes, such as plasma etch processes, are not required to remove the thermal decomposition materials.

19 Claims, 7 Drawing Sheets

(51) Int. Cl.
*H01L 21/033* (2006.01)
*H01L 21/308* (2006.01)
*H01L 21/3105* (2006.01)
*H01L 21/311* (2006.01)
*H01L 21/3213* (2006.01)

(52) U.S. Cl.
CPC .. *H01L 21/02318* (2013.01); *H01L 21/02532* (2013.01); *H01L 21/308* (2013.01); *H01L 21/3081* (2013.01); *H01L 21/311* (2013.01); *H01L 21/3105* (2013.01); *H01L 21/31116* (2013.01); *H01L 21/3213* (2013.01)

(56) References Cited

U.S. PATENT DOCUMENTS

| | | | |
|---|---|---|---|
| 2008/0265415 A1* | 10/2008 | Colburn | H01L 21/0331 257/750 |
| 2008/0299774 A1 | 12/2008 | Sandhu | |
| 2009/0130863 A1* | 5/2009 | Toma | H01L 23/5222 438/795 |
| 2010/0267237 A1* | 10/2010 | Bonser | H01L 21/3086 438/689 |
| 2016/0225640 A1* | 8/2016 | Raley | H01L 21/31144 |
| 2018/0138078 A1 | 5/2018 | Farrell et al. | |

* cited by examiner

__US 10,978,300 B2__

METHODS TO REDUCE GOUGING FOR CORE REMOVAL PROCESSES USING THERMAL DECOMPOSITION MATERIALS

RELATED APPLICATIONS

This application claims priority to the following provisional applications: U.S. Provisional Patent Application Ser. No. 62/696,692, filed Jul. 11, 2018, and entitled "METHODS TO REDUCE GOUGING FOR MANDREL PULL PROCESSES," and U.S. Provisional Patent Application Ser. No. 62/729,145, filed Sep. 10, 2018, and entitled "METHODS TO REDUCE GOUGING FOR CORE REMOVAL PROCESSES USING THERMAL DECOMPOSITION MATERIALS," which are hereby incorporated by reference in their entirety.

BACKGROUND

The present disclosure relates to methods for the manufacture of microelectronic workpieces including the formation of patterned structures on microelectronic workpieces.

Device formation within microelectronic workpieces typically involves a series of manufacturing techniques related to the formation, patterning, and removal of a number of layers of material on a substrate. To meet the physical and electrical specifications of current and next generation semiconductor devices, processing flows are being requested to reduce feature size while maintaining structure integrity for various patterning processes.

Self-aligned multiple patterning (SAMP) processes, such as self-aligned double patterning (SADP) processes and self-aligned quadruple patterning (SAQP), have been developed to reduce feature sizes beyond what is directly achievable by lithography processes.

For some SAMP processes and particularly for SADP processes, spacers are typically formed as side wall structures adjacent cores on a substrate being processed, and the core material is later removed. For example, an organic film such as an organic planarizing layer (OPL) or an organic dielectric layer (ODL) is often used as a material for the cores, and oxide ($SiO_2$) is often used as a material to form spacers adjacent the ODL/OPL cores. The ODL/OPL core material is then removed after an etch back of the spacer material is used to form the spacers as side wall structures adjacent the cores. This core removal process is typically called a mandrel pull and is often performed by a plasma etch process such as a reactive ion etch (RIE) process. These etch processes, however, can cause undesired gouging when exposed portions of an underlying layer, such as a hard mask layer, are not evenly etched during the etch process (e.g., RIE process). As one example, the gouging amount for a hard mask layer under the cores can differ from the gouging for the hard mask layer that is exposed within gaps between the cores and spacers. These differences in gouging can cause problems in later process steps. For example, these gouging differences can cause pitch-walking during subsequent wiring formation process and/or cause other subsequent processing defects for the microelectronic workpieces being manufactured.

For other SAMP processes and particularly for SAQP processes, amorphous silicon (a-Si) is used as the core material that is later removed in a mandrel pull process. A spacer material is deposited on this core material and an etch back of spacer material is then performed to form spacers adjacent the cores. The cores are then removed in the mandrel pull process. However, when an underlying layer such as a hard mask layer is exposed during the mandrel pull process, differences in gouging can occur. For example, gouging of exposed portions of a hard mask layer during the etch process for the mandrel pull can differ from gouging associated with portions of the hard mask layer under the core material (e.g., a-Si). As indicated above, these differences in gouging can cause problems in later process steps. For example, these gouging differences can cause pitch-walking during subsequent wiring formation process and/or cause other subsequent processing defects for the microelectronic workpieces being manufactured.

FIGS. 1A-1E (Prior Art) and FIGS. 2A-D (Prior Art) provide background information for prior solutions where undesired gouging occurs during SAMP processes such as during mandrel pull processes and/or during subsequent etch processes.

Looking first to FIGS. 1A-E (Prior Art), cross-section views are shown for an example where gouging occurs for prior solutions during an etch process (e.g., dry etch) applied for a mandrel pull process where an organic dielectric layer (ODL) is used for the SAMP core material.

FIG. 1A (Prior Art) provides cross-section views of an example embodiment 100 where stacked layers have been formed on a substrate (not shown) including an anti-reflective layer 110, an ODL planarization layer 120, and a hard mask layer 130 (e.g., SiN). In addition, a photoresist layer 140 has been deposited and patterned, for example, using lithography and etch processes.

FIG. 1B (Prior Art) provides a cross-section view of an example embodiment 101 after the photoresist (PR) pattern is transferred to underlying layers above the hard mask layer 130. For example, one or more etch processes can be used to transfer the pattern formed in the PR layer 140 to underlying layers 110/120 and to form cores 150.

FIG. 1C (Prior Art) provides a cross-section view of an example embodiment 102 after a spacer material layer 155 has been deposited. As shown, the spacer material layer 155, such as an oxide layer, is deposited over the cores 150. The cores 150 still include the anti-reflective layer 110 and the ODL layer 120.

FIG. 1D (Prior Art) provides a cross-section view of an example embodiment 103 after an etch back process has been performed. For example, an etch back process is performed to etch back the spacer layer 155 and form spacers 160 along the side walls of the cores 150. This etch back process can also remove the anti-reflective layer 110 shown in FIG. 1C thereby leaving only the ODL layer 120 for the cores 150.

FIG. 1E (Prior Art) provides a cross-section view of an example embodiment 104 after a mandrel pull process has been performed. As shown, the mandrel pull process, such as an ash process, is used to remove the cores 150 shown in FIG. 1D. This mandrel pull process, however, introduces gouging 170 in the hard mask layer 130 where it is exposed in the gaps between the cores 150 and spacers 160 shown in FIG. 1D. This gouging 170 causes deterioration of etching uniformity in the etching process of subsequent patterns formed through the SAMP process.

FIGS. 2A-2C (Prior Art) provide cross-section views for an example where gouging occurs for prior solutions during an etch process (e.g., dry etch) applied for a mandrel pull process where another material, such as amorphous silicon (a-Si), is used for the core material.

Looking first to FIG. 2A (Prior Art), an example embodiment 200 is shown where a spacer material layer 255, such as an oxide spacer layer, is deposited over cores 250 made from amorphous silicon. The cores 250 have been previously formed over a substrate (not shown), for example, using one or more patterning, etch, and deposition processes. The spacer material layer 255 and the cores 250 have been formed on a hard mask layer 230.

FIG. 2B (Prior Art) provides a cross-section view of an example embodiment 201 after an etch back process has been performed. For example, an etch back process is performed to etch back the spacer material layer 255 and form spacers 260 along the side walls of the cores 250. For example, an oxide etch back can be used where an oxide spacer material is used.

FIG. 2C (Prior Art) provides a cross-section view of an example embodiment 202 after a mandrel pull process has been performed. As shown, the mandrel pull process, such as silicon etch process, is used to remove the a-Si cores 250 shown in FIG. 2B. This mandrel pull process, however, introduces gouging 270 in the hard mask layer 230 where it is exposed in the gaps between the cores 250 and spacers 260 shown in FIG. 2B. This gouging 270 causes deterioration of etching uniformity in the etching process of subsequent patterns formed through the SAMP process.

SUMMARY

Embodiments are described herein to reduce gouging during multi-patterning processes using thermal decomposition materials. For one embodiment, gouging is reduced or suppressed by using thermal decomposition materials as cores during multiple patterning processes. For one embodiment, gouging is reduced or suppressed by using thermal decomposition materials as a gap fill material during multiple patterning processes. By using thermal decomposition material as described herein, gouging of an underlying layer, such as a hard mask layer, can be reduced or suppressed for patterned structures being formed using the self-aligned multi-patterning processes because more destructive etch processes, such as plasma etch processes, are not required to remove the thermal decomposition materials. Different or additional features, variations, and embodiments can also be implemented, and related systems and methods can be utilized as well.

For one embodiment, a method to improve etch uniformity for processing of microelectronic workpieces is disclosed including providing a substrate with a material layer, forming cores and spacers on the material layer with two spacers adjacent each core as part of a self-aligned multi-patterning (SAMP) process where the forming includes forming a layer of a thermal decomposition material, and removing the cores to leave the spacers where the removing includes removing the thermal decomposition material with a thermal treatment.

In additional embodiments, the thermal treatment has a temperature range from 100 to 450 degrees Celsius. In further embodiments, the thermal treatment comprises an anneal process.

In additional embodiments, the thermal decomposition material has a depolymerizability characteristic such that it can be removed by thermal treatment of 100 to 450 degrees Celsius. In additional embodiments, the thermal decomposition material has a depolymerizability characteristic such that it can be removed by thermal treatment of 250 to 450 degrees Celsius and such that it is stable from 150 to 215 degrees Celsius.

In additional embodiments, a rate for the removing is controlled by adjusting at least one of temperature or pressure for a processing chamber within which substrate is being processed. In additional embodiments, the thermal decomposition material includes at least one of urethane, polymethyl methacrylate (PMMA), or a monomer.

In additional embodiments, the thermal decomposition material includes an ashing-less coating (ALC) material. In further embodiments, the ALC material includes a urea binding resin. In further embodiments, the urea binding resin includes polyurea having depolymerizability characteristics such that it can be removed by thermal treatment of less than 450° C.

In additional embodiments, the layer of thermal decomposition material is used to form the cores. In further embodiments, the forming includes forming the layer of thermal decomposition material over the material layer, patterning the layer of thermal decomposition material to form the cores, depositing a spacer layer over the cores, and performing an etch back of the spacer layer to leave spacers as side wall structures adjacent the cores. In still further embodiments, the removing includes applying the thermal treatment to remove the cores of thermal decomposition material. Still further, the material layer can be a hard mask layer. In addition, a gouging target for the hard mask layer can be achieved.

In additional embodiments, the layer of thermal decomposition material is used as gap fill material for the removing. In further embodiments, the forming includes forming a core material layer over the material layer, patterning the core material layer to form cores on the material layer, depositing a spacer layer over the cores, and performing an etch back of the spacer layer to leave spacers as side wall structures adjacent the cores. In still further embodiments, the remove includes forming a layer of thermal decomposition material over the cores and spacers, performing an etch back of the layer of thermal decomposition material using a thermal treatment to expose the cores and to leave the thermal decomposition material as the gap fill material between the cores and spacers, performing a mandrel pull process to remove the cores, and applying the thermal treatment to remove the cores of thermal decomposition material. Still further, the material layer can be a hard mask layer. In addition, a gouging target for the hard mask layer can be achieved.

BRIEF DESCRIPTION OF THE DRAWINGS

A more complete understanding of the present inventions and advantages thereof may be acquired by referring to the following description taken in conjunction with the accompanying drawings, in which like reference numbers indicate like features. It is to be noted, however, that the accompanying drawings illustrate only exemplary embodiments of the disclosed concepts and are therefore not to be considered limiting of the scope, for the disclosed concepts may admit to other equally effective embodiments.

DETAILED DESCRIPTION

Figure 1A:
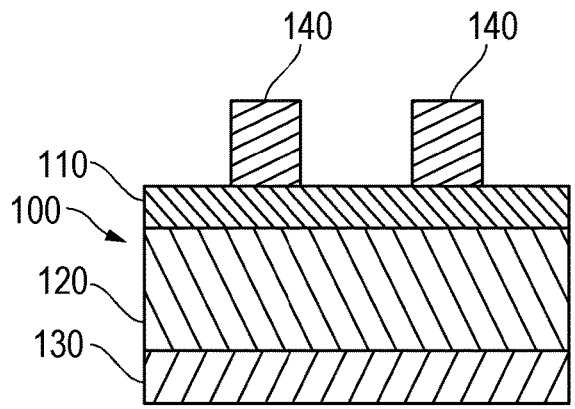
FIGS. 1A-1E (Prior Art) provides cross-section views for an example where gouging occurs for prior solutions during an etch process applied for a mandrel pull process where an organic dielectric layer is used for the SAMP core material.
Figure 1B:
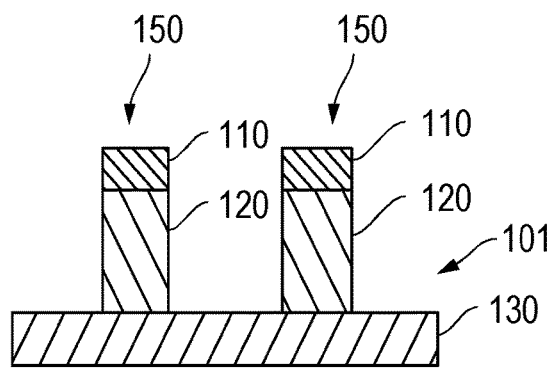
Figure 1C:
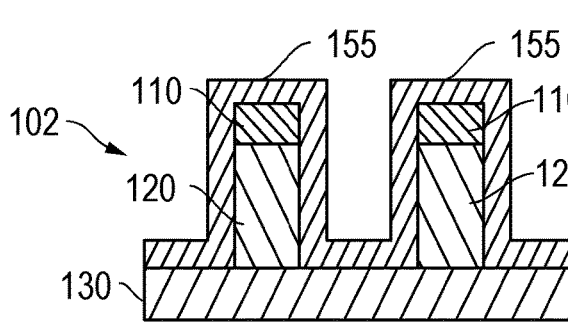
Figure 1D:
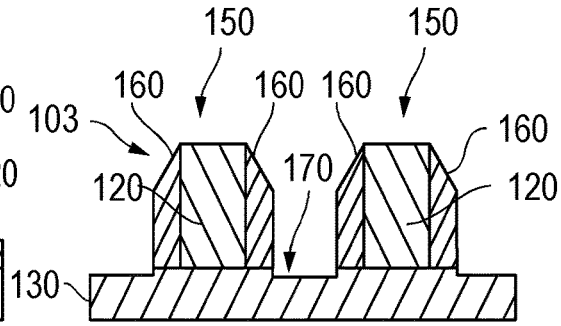
Figure 1E:
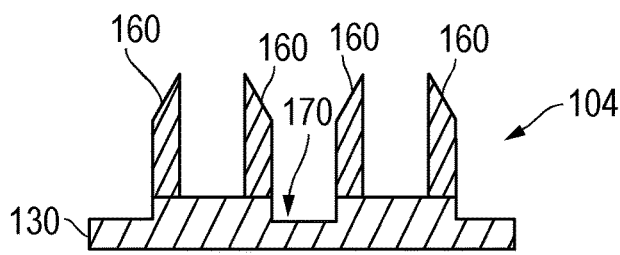
Figure 2A:
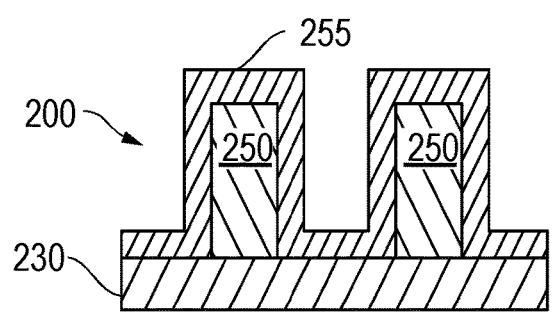
FIGS. 2A-2C (Prior Art) provide cross-section views for an example where gouging occurs for prior solutions during an etch process applied for a mandrel pull process where another material, such as amorphous silicon, is used for the core material FIGS. 3A-3E provide example cross-section views where a thermal decomposition material is used as the core material during multiple patterning processes according to reduce or eliminate the undesired gouging experienced in prior solutions.
Figure 2B:
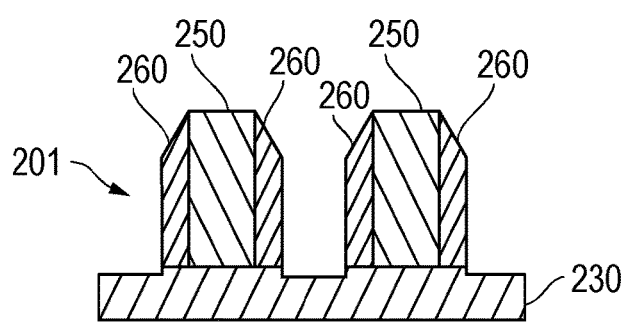
Figure 2C:
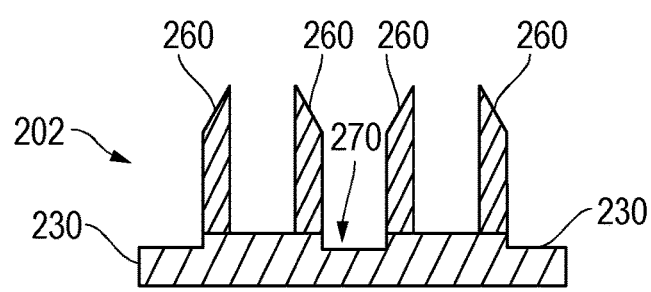

Embodiments are disclosed that reduce gouging during multi-patterning processes for the manufacture of microelectronic workpieces. This reduction in gouging is achieved using thermal decomposition materials that can be removed through thermal treatment processes without requiring etch processes. Other advantages and implementations can also be achieved while still taking advantage of the process techniques described herein.

As described herein, thermal decomposition materials are used in multiple patterning processes so that gouging of underlying layers is reduced during the manufacture of microelectronic workpieces. The thermal decomposition materials are preferably materials that can be removed with a thermal treatment having a temperature range from 100 to 450 degrees Celsius (° C.). For one embodiment, an ashing-less coating (ALC) material can be used as the thermal decomposition material, and this ALC material can be removed by thermal treatment using a de-polymerization temperature from 300° C. to 400° C. Other thermal decomposition materials, such a urea binding resin, can also be used that have depolymerizability characteristics such that they can be removed by thermal treatment from 200° C. to 240° C. Other thermal decomposition materials can also be used that can be removed using thermal treatments from 100° C. to 450° C. More generally, thermal decomposition materials having depolymerizability characteristics such that they can be removed by thermal treatment from 100° C. to 450° C. are preferable for the embodiments described herein. These low temperature processes reduce gouging of underlying material layers in SAMP processes such as SADP and SAQP processes.

For one example, by using thermal decomposition material as a core material for a SAMP process, it is possible to remove the cores during a mandrel pull process by thermal treatment without using an etch process such as a plasma etch process (e.g., RIE process) for the mandrel pull process. As such, exposed underlying layers (e.g., hard mask layer) within gaps between cores are not gouged or otherwise affected by the plasma etch process. Gouging is thereby suppressed in these exposed underlying layers, and the influence of defects caused by gouging, such as pitch walking, can be reduced or minimized.

As another example, by using thermal decomposition material to fill gaps between cores/spacers and thereby protect exposed underlying layers during a mandrel pull process, the underlying layer within the gaps is protected during the etch process for the mandrel pull. As such, gouging is not introduced in these gap regions during the removal of cores made of other materials (e.g. a-Si). Further, because this thermal decomposition material can be removed by thermal treatment, an etch process is not necessary to remove the thermal decomposition material and gouging is further suppressed.

The disclosed embodiments provide one or more of the following features or advantages: (1) suppressing gouging by not using an ash process to remove organic layers, (2) replacing ODL/OPL with thermal decomposition materials, (3) using thermal decomposition materials for gap fill methods during mandrel pull processes, (4) reshaping spacers with no spacer profile change to suppress gouging, and/or (5) providing other features or advantages based upon the use of thermal decomposition materials during SAMP processes.

Looking now to FIGS. 3A-E and FIGS. 4A-D, example embodiments are shown where thermal decomposition materials are used to reduce gouging experienced with prior solutions.

FIGS. 3A-E provide example cross-section views where a thermal decomposition material is used as the core material during SAMP processes to reduce or eliminate the undesired gouging experienced in prior solutions such as shown in FIGS. 1A-E (Prior Art). For example, instead of an ODL or OPL layer as in prior solutions, a thermal composition material is formed as a material layer above a hard mask layer and patterned to form cores.

Figure 3A:
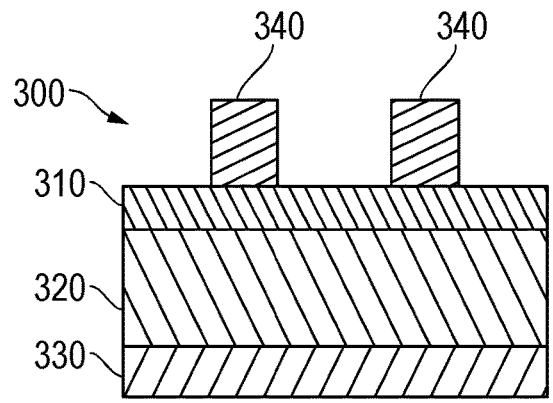

FIG. 3A provides cross-section view of an embodiment 300 where a thermal decomposition material layer has been formed instead of the ODL or OPL layer to provide cores for a multiple patterning process such as a SAMP process. As shown, stacked layers have been formed on a substrate (not shown) including an anti-reflective layer 310, a thermal decomposition layer 320, and a hard mask layer 330 (e.g., SiN). In addition, a photoresist layer 340 is deposited and patterned using lithography.

Figure 3B:
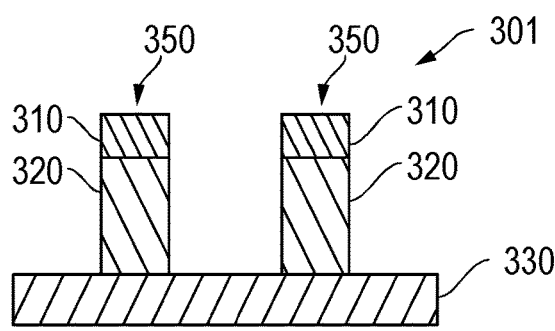

FIG. 3B provides a cross-section view of an example embodiment 301 after the pattern within the photoresist (PR) pattern is transferred to underlying layers including the thermal decomposition layer 320. For example, one or more etch processes can be used to transfer the pattern in the PR layer 340 to underlying layers and to form cores 350 within the underlying layers including the anti-reflective layer 310 and the thermal decomposition material 320.

Figure 3C:
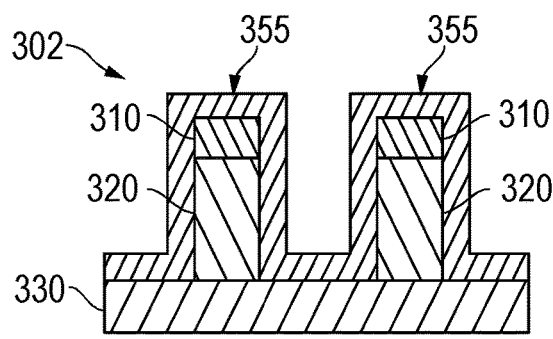

FIG. 3C provides a cross-section view of an example embodiment 302 after a spacer material layer 355 has been deposited. As shown, the spacer material layer 355, such as an oxide layer, is deposited over the cores 350 that still include the anti-reflective layer 310 and the thermal decomposition material 320.

Figure 3D:
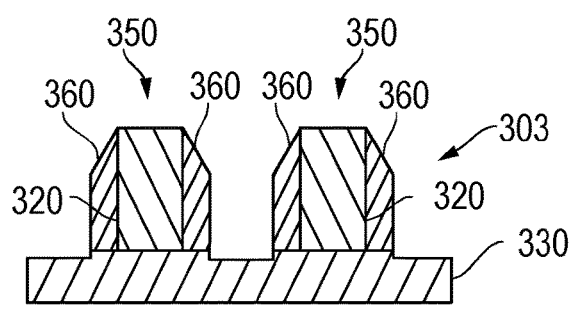

FIG. 3D provides a cross-section view of an example embodiment 303 after an etch back process has been performed. For example, an etch back process is performed to etch back the spacer material layer 355 shown in FIG. 3C and form spacers 360 along the side walls of the cores 350. Thus, after the spacer material layer 355 is formed and etched, the spacers 360 are left on side walls of cores 350. This etch back process can also remove the anti-reflective layer 310 shown in FIG. 3C thereby leaving only the thermal decomposition material 320 for the cores 350.

Figure 3E:
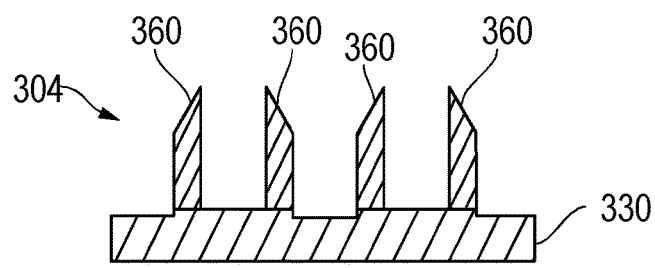

FIG. 3E provides a cross-section view of an example embodiment 304 after a mandrel pull process has been performed to remove the cores 350. Because the cores 350 are formed of the thermal decomposition material 320 as shown in FIG. 3D, the cores 350 can then be pulled by a thermal treatment such as a low temperature anneal (e.g., from 100 to 450 degrees Celsius). As one example, the low temperature anneal can be performed using a heated plate.

By carrying out thermal treatment after etch back to leave only the oxide spacers 360, the depolymerizable thermal decomposition material is removed without requiring an etch process which can lead to gouging. Because there is no need to perform subsequent etch processes for the mandrel pull, such as plasma etch processes (e.g., RIE process), gouging in underlying layers within gap portions are reduced or suppressed. By using the thermal decomposition material 320 for the cores 350, a gouging target for the hard mask layer 330 is achieved.

FIGS. 4A-E provide example cross-section views where a thermal decomposition material is used as a gap fill material during a multiple patterning process, such as a SAMP processes, to reduce or eliminate the undesired gouging experienced in prior solutions such as shown in FIGS. 2A-D (Prior Art).

Figure 4A:
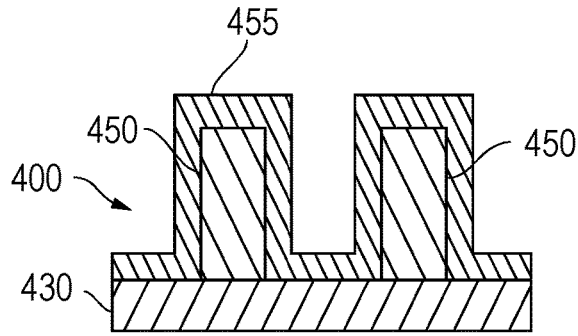
FIGS. 4A-4E provide example cross-section views where a thermal decomposition material is used as a gap fill material during a multiple patterning process, such as a SAMP processes, to reduce or eliminate the undesired gouging experienced in prior solutions.

FIG. 4A provides a cross-section view of an example embodiment 400 where a spacer material layer 455, such as a spacer material layer made from oxide ($SiO_2$), is deposited over cores 450 made from another material such as amorphous silicon. The cores 450 have been previously formed over a substrate (not shown), for example, using one or more patterning, etch, and deposition processes. As such, the spacer material layer 455 is formed over a core made of another material, such as a-Si, which has in turned been formed over a hard mask layer 430.

Figure 4B:
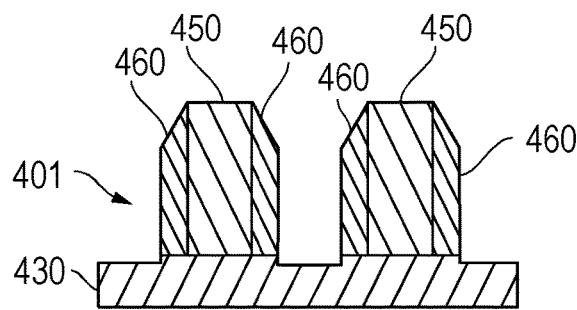

FIG. 4B provides a cross-section view of an example embodiment 401 after an etch back process has been performed on the spacer material layer 455 deposited on the cores 450. For example, an etch back process is performed to etch back the spacer material layer 455 and leave spacers 460 along the side walls of the cores 450. For example, an oxide etch back can be used where an oxide spacer material is used.

Figure 4C:
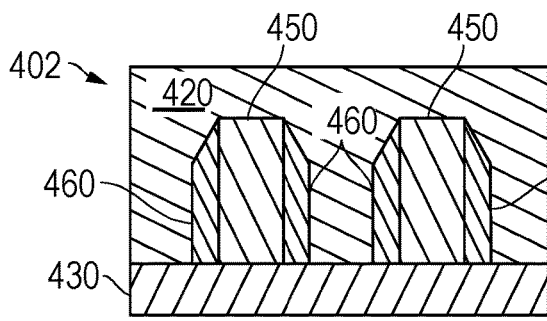

FIG. 4C provides a cross-section view of an example embodiment 402 after a thermal decomposition material 420 has been deposited over the cores 450 and spacers 460. For example, after spacer formation, a thermal decomposition material 420 is deposited to protect the gap portions between the cores 450 and spacers 460.

Figure 4D:
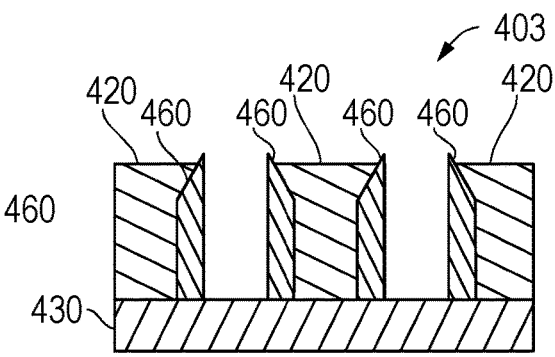

FIG. 4D provides a cross-section view of an example embodiment 403 after a mandrel pull process has been performed to remove the cores 450 shown in FIG. 4C. Gouging is not introduced in this process because the gap portions between the cores/spacers 450/460 are protected by the thermal decomposition material 420 during the mandrel pull process. For one embodiment, it is further noted that an etch back process can be performed prior to the mandrel pull process to remove a portion of the thermal decomposition material 420 and thereby expose the top surfaces of the cores 450. This etch back of the thermal decomposition material 420 can be achieved using a thermal treatment as described herein. A planarization process could also be used instead of and/or in addition to an etch back to expose the top surfaces of the cores 450.

Figure 4E:
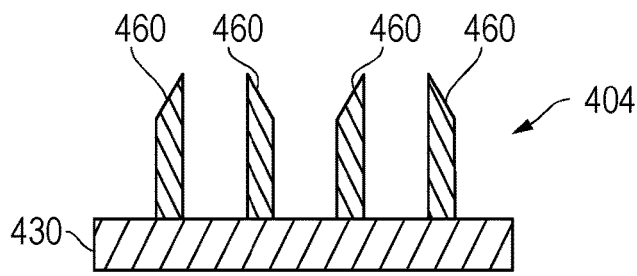

FIG. 4E provides a cross-section view of an example embodiment 404 after the thermal decomposition material 420 has been removed using a thermal treatment as described herein. Because the thermal decomposition material 420 can be removed by a thermal treatment, such as a low temperature anneal (e.g., from 100 to 450 degrees Celsius), etch processes such as plasma etch processes (e.g. RIE process) are not needed. As such, gouging due to such plasma etch processes is further reduced or suppressed. Further, by using the thermal decomposition material 420 as the gap fill material, a gouging target for the hard mask layer 430 is achieved.

Figure 5:
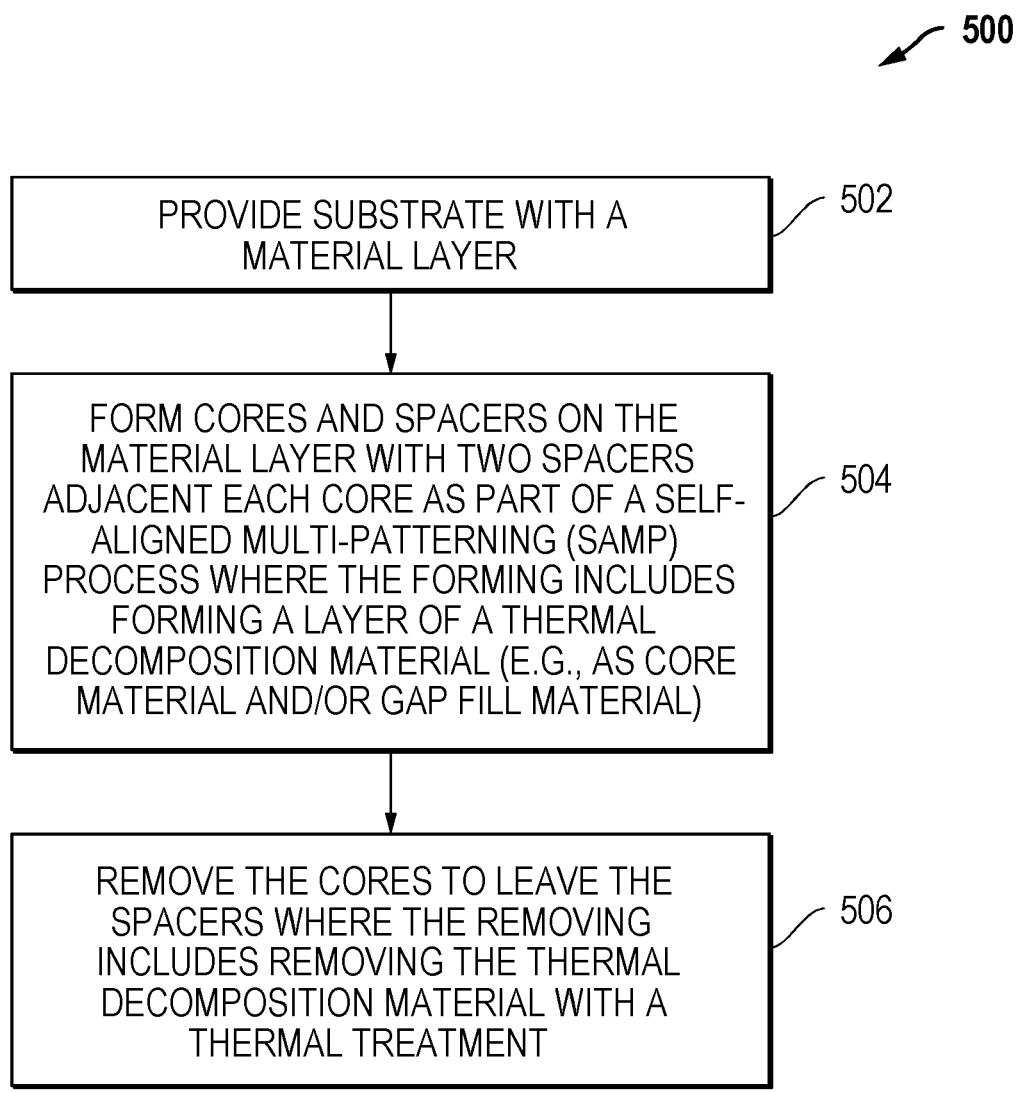
FIG. 5 provides a process diagram of an example embodiment where thermal decomposition materials are used in multiple patterning processes to reduce or suppress gouging in underlying layers.

FIG. 5 provides a process flow diagram for an example embodiment 500 where thermal decomposition materials are used in multiple patterning processes to reduce or suppress gouging in underlying layers and improve etch uniformity for processing of microelectronic workpieces. In block 502, a substrate is provided with a material layer. In block 504, cores and spacers are formed on the material layer with two spacers adjacent each core as part of a self-aligned multi-patterning (SAMP) process. Further, the core/spacer formation includes forming a layer of a thermal decomposition material, for example, as a core material and/or as a gap fill material. In block 506, the cores are removed to leave the spacers. Further, the core removal includes removing the thermal decomposition material with a thermal treatment. For example, the thermal treatment can be used to remove the cores where the thermal decomposition material is used as core material, and the thermal treatment can be used to remove gap fill material where the thermal decomposition material is used to fill gaps between cores/spacers. Additional and/or different process steps can also be used while still taking advantage of the techniques described herein.

Figure 6A:
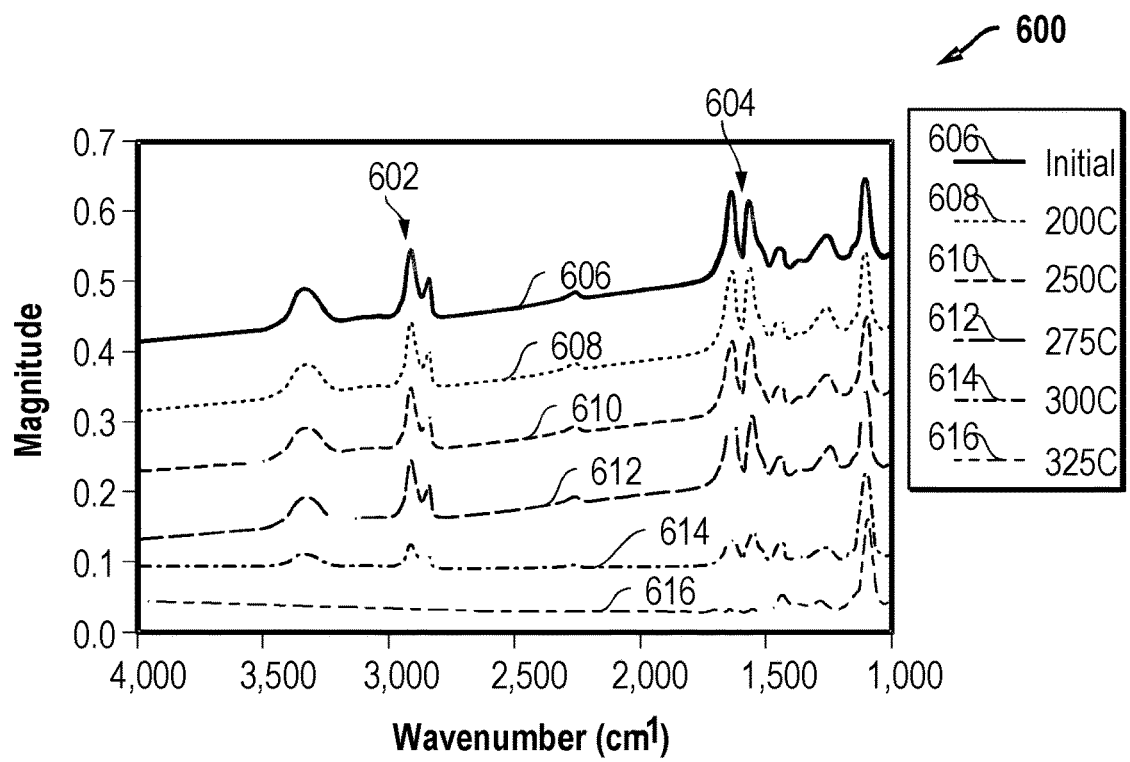
FIGS. 6A-B provide diagrams for example thermal behaviors for representative thermal decomposition materials that can be used for the disclosed embodiments.
Figure 6B:
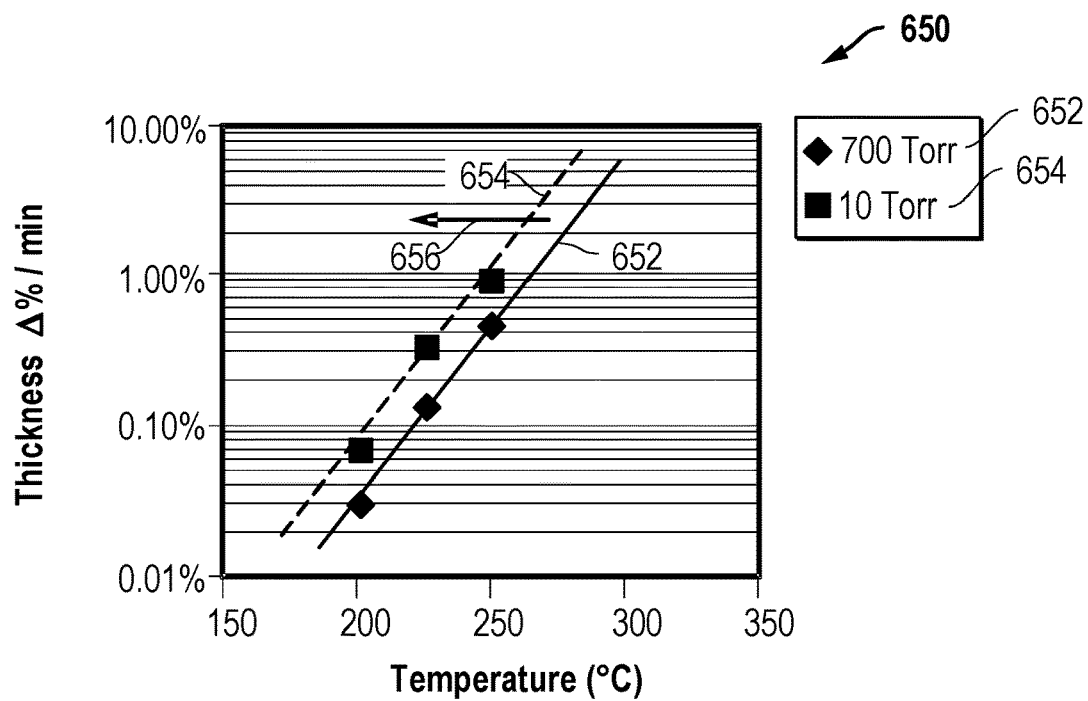

FIGS. 6A and 6B provide diagrams for example thermal behaviors for a representative thermal decomposition material (e.g., ALC material). In FIGS. 6A and 6B, thermal behavior is tested using a 400 nanometer (nm) layer of thermal decomposition material (e.g., a 400 nm ALC layer) formed on silicon. This thermal decomposition layer on silicon is then annealed using a hot plater under a nitrogen gas. This thermal annealing is performed at different temperature levels. After annealing, the removal of the thermal decomposition material layer is tested using FT-IR (Fourier transform infrared spectroscopy) to determine magnitudes (N) for different electromagnetic emissions based upon wavenumber (K) as shown in FIG. 6A. The removal rate is also tested under different pressures as shown in FIG. 6B.

Looking in more detail to FIG. 6A, a diagram 600 is provided that shows the effectiveness of thermal treatments in removing the thermal decomposition material. In particular, thermal decomposition material (e.g., ALC) formed on a substrate (e.g., silicon substrate) is annealed at different temperature levels 606, 608, 610, 612, 614, and 616 (initial, 200° C., 250° C., 275° C., 300° C., 325° C.), for example, using a hot plate anneal under a nitrogen ($N_2$) gas. The spectral peaks 602 and 604 indicate the presence of the thermal decomposition material, and the reduced magnitude levels for the progressively higher temperatures show that more of the thermal decomposition material is removed as the temperature of the anneal is increased. The lack of peaks 602/604 in the FT-IR analysis for the temperature level 616 reveals that the ALC thermal decomposition material is effectively removed in this example for the 325° C. thermal anneal.

FIG. 6B provides a diagram 650 that shows removal rates for thermal treatments of the thermal decomposition material under different pressures. For one thermal treatment test, a pressure of 700 Torr was used. The line 652 represents a linear fit to measured removal rates at different temperatures for thermal anneals performed under this 700 Torr pressure. The removal rate is represented by percent change in thickness per min (Thickness A %/min). For another thermal treatment test, a pressure of 10 Torr or near vacuum was used. The line 654 represents a linear fit to measured removal rates at different temperatures for thermal anneals performed under this 10 Torr pressure. As shown by the removing rate diagram 650, the temperature for the thermal treatment to remove the thermal decomposition material can be lowered by reducing the pressure as indicated by arrow 656. As also shown in the removing rate diagram 650, adjusting the temperature of the anneal process also adjusts the relative removal rate of percent change in thickness per minute of thermal treatment. More generally, it is noted that these examples show that the rate for the removal of the thermal decomposition can be controlled by adjusting at least one of temperature or pressure for a processing chamber within which the substrate for a microelectronic workpiece is being processed.

Figure 7:
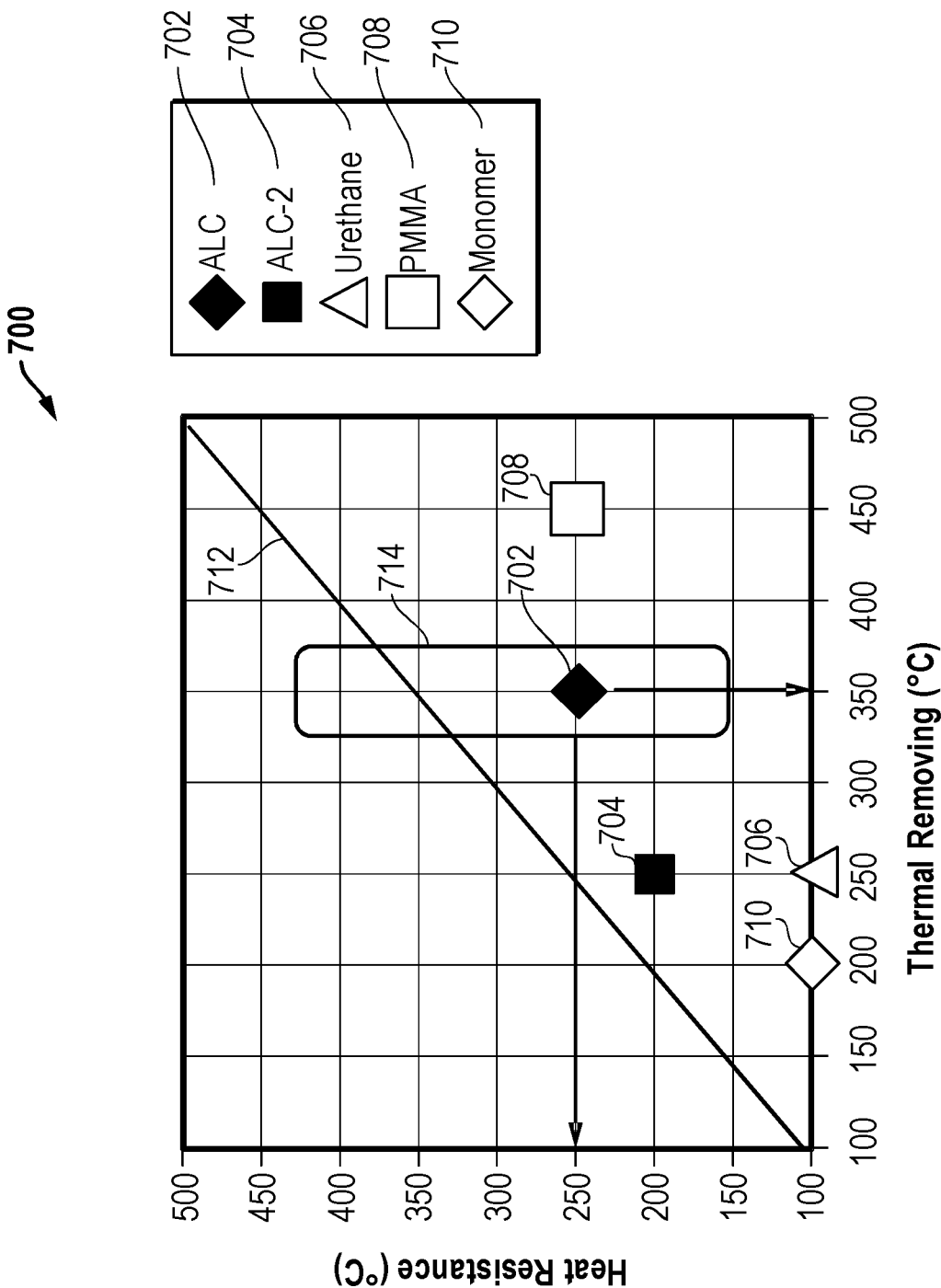
FIG. 7 provides a diagram for thermal removal temperatures and heat resistance for example thermal decomposition materials that can be used for the disclosed embodiments.

FIG. 7 provides a diagram 700 of thermal removal temperatures and heat resistance for example thermal decomposition materials. The thermal removal temperature represents the temperature at which a thermal treatment removes the thermal decomposition material, for example, by a degas process. The heat resistance represents the temperature level below which the thermal decomposition material remains stable and above which the decomposition material becomes unstable.

With respect to thermal removal, temperatures at which different thermal decomposition materials are removed (e.g., degas) are shown for ALC materials (e.g., ALC, ALC-2) 702/704, urethane 706, polymethyl methacrylate (PMMA) 708, and monomers 710. As shown, these materials have thermal removal temperatures for thermal treatments from 100° C. to 450° C. Other materials could also be used that have similar thermal removal characteristics while still taking advantage of the techniques described herein. For example, materials having depolymerizability characteristics such that they can be removed by thermal treatment of 100° C. to 450° C. can be used as a thermal decomposition material for the techniques described herein.

With respect to thermal stability, temperatures at which the different thermal decomposition materials become unstable are also shown for ALC materials (e.g., ALC, ALC-2) 702/704, urethane 706, polymethyl methacrylate (PMMA) 708, and monomers 710. It is noted for certain processes, such as where lithography anneal processes are used, it is desirable for the thermal decomposition material to have thermal stability from 100° C. to 215° C. For example, this thermal stability will allow the thermal decomposition material to resist depolymerization or removal through an etch back process for a silicon anti-reflective coating (SiARC). For such an embodiment where thermal stability is desired for lower temperatures, it is preferred to use materials having depolymerizability characteristics such that they can be removed by thermal treatments from 250° C. to 450° C. and have thermal stability below this temperature range, for example, from 150° C. to 215° C. As shown with respect to element 714, for example, the ALC material 702 meets these parameters as it has a thermal removal temperature of 350° C. yet remains stable up to 250° C. Other variations could also be used for particular SAMP processes.

It is noted that the ALC and ALC-2 material can be materials such as urea binding resins (e.g., polyurea) that have depolymerizability characteristics such that they can be removed by thermal treatment of less than 450° C., and in another embodiment by thermal treatment of less than 300° C. Through the application of thermal energy during the thermal treatment, the thermal decomposition material depolymerizes and is removed from the substrate. As described herein, by using such thermal decomposition materials, as opposed to standard organic planarization or dielectric layers, gouging of underlying material layers during SAMP processes is reduced or eliminated.

The techniques described herein are not limited to a particular thermal decomposition material, as a variety of materials may be utilized while still obtaining the benefits described herein. However, for one embodiment a urea binding resin, such as polyuria, is used that can be formed via a thin film deposition. An exemplary technique for the formation of a polyurea and the removal of such a polyurea by a depolymerization process to decompose thermally the polyurea are described in more detail in U.S. patent application Ser. No. 15/654,307 filed Jul. 19, 2017, entitled "Method of Fabricating Semiconductor Device, Vacuum Processing Apparatus and Substrate Processing Apparatus," to Yatsuda et al., the disclosure of which is expressly incorporated herein by reference in its entirety. The techniques described in U.S. patent application Ser. No. 15/654,307 include, but are not limited to, copolymerizing isocyanate and amine as raw material monomers to form a urea bond, for example, using a vapor deposition polymerization process. As described in U.S. patent application Ser. No. 15/654,307, a liquid process may also be used to form the polyurea. Further, as described, the polyurea may be subsequently depolymerized to an amine and vaporized by the application of a thermal treatment. It will be recognized, however, that other formation processes and other removal processes may be utilized while still gaining the benefits of the use of a thermal decomposition layer and thermal removal of such layer as described herein. Further, it will be recognized that the techniques described herein are not limited to polyurea and other materials and/or combinations or variants of polyurea and other materials may be utilized as the thermal decomposition material.

It is noted that one or more deposition processes can be used to form the material layers described herein. For example, one or more depositions can be implemented using chemical vapor deposition (CVD), plasma enhanced CVD (PECVD), physical vapor deposition (PVD), atomic layer deposition (ALD), and/or other deposition processes. For a plasma deposition process, a precursor gas mixture can be used including but not limited to hydrocarbons, fluorocarbons, or nitrogen containing hydrocarbons in combination with one or more dilution gases (e.g., argon, nitrogen, etc.) at a variety of pressure, power, flow and temperature conditions. Lithography processes with respect to PR layers can be implemented using optical lithography, extreme ultraviolet (EUV) lithography, and/or other lithography processes. The etch processes can be implemented using plasma etch processes, discharge etch processes, and/or other desired etch processes. For example, plasma etch processes can be implemented using plasma containing fluorocarbons, oxygen, nitrogen, hydrogen, argon, and/or other gases. In addition, operating variables for process steps can be controlled to ensure that CD target parameters for vias are achieved during via formation. The operating variables may include, for example, the chamber temperature, chamber pressure, flowrates of gases, frequency and/or power applied to electrode assembly in the generation of plasma, and/or other operating variables for the processing steps. Variations can also be implemented while still taking advantage of the techniques described herein.

It is noted that reference throughout this specification to "one embodiment" or "an embodiment" means that a particular feature, structure, material, or characteristic described in connection with the embodiment is included in at least one embodiment of the invention, but do not denote that they are present in every embodiment. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

"Microelectronic workpiece" as used herein generically refers to the object being processed in accordance with the invention. The microelectronic workpiece may include any material portion or structure of a device, particularly a semiconductor or other electronics device, and may, for example, be a base substrate structure, such as a semiconductor substrate or a layer on or overlying a base substrate structure such as a thin film. Thus, workpiece is not intended to be limited to any particular base structure, underlying layer or overlying layer, patterned or unpatterned, but rather, is contemplated to include any such layer or base structure, and any combination of layers and/or base structures. The description below may reference particular types of substrates, but this is for illustrative purposes only and not limitation.

The term "substrate" as used herein means and includes a base material or construction upon which materials are formed. It will be appreciated that the substrate may include a single material, a plurality of layers of different materials, a layer or layers having regions of different materials or different structures in them, etc. These materials may include semiconductors, insulators, conductors, or combinations thereof. For example, the substrate may be a semiconductor substrate, a base semiconductor layer on a supporting structure, a metal electrode or a semiconductor substrate having one or more layers, structures or regions formed thereon. The substrate may be a conventional silicon substrate or other bulk substrate comprising a layer of semi-conductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped.

Systems and methods for processing a microelectronic workpiece are described in various embodiments. One skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Further modifications and alternative embodiments of the described systems and methods will be apparent to those skilled in the art in view of this description. It will be recognized, therefore, that the described systems and methods are not limited by these example arrangements. It is to be understood that the forms of the systems and methods herein shown and described are to be taken as example embodiments. Various changes may be made in the implementations. Thus, although the inventions are described herein with reference to specific embodiments, various modifications and changes can be made without departing from the scope of the present inventions. Accordingly, the specification and figures are to be regarded in an illustrative rather than a restrictive sense, and such modifications are intended to be included within the scope of the present inventions. Further, any benefits, advantages, or solutions to problems that are described herein with regard to specific embodiments are not intended to be construed as a critical, required, or essential feature or element of any or all the claims.

What is claimed is:

1. A method to improve etch uniformity for processing of microelectronic workpieces, comprising:
    providing a substrate with a material layer;
    forming cores and spacers on the material layer with two spacers adjacent each core as part of a self-aligned multi-patterning (SAMP) process, the forming comprising:
        (i) forming a layer of a thermal decomposition material, and forming cores of the thermal decomposition material;
        (ii) depositing a spacer material such that the spacer material extends above and along sides of the cores;
        (iii) performing an etching which etches portions of the spacer material above the cores while portions of the spacer material remain on sides of the core to thereby form the spacers, and exposing top portions of the cores without spacer material or other material above the cores; and
    the method further comprising, after exposing the top portions of the cores, removing the cores to leave the spacers, the removing including removing the thermal decomposition material with a thermal treatment at which the thermal decomposition material is removed, and wherein the thermal decomposition material includes an ashing-less coating (ALC) material.

2. The method of claim 1, wherein the thermal treatment has a temperature range from 100 to 450 degrees Celsius.

3. The method of claim 2, wherein the thermal treatment comprises an anneal process.

4. The method of claim 1, wherein the thermal decomposition material has a depolymerizability characteristic such that it can be removed by thermal treatment of 100 to 450 degrees Celsius.

5. The method of claim 1, wherein the thermal decomposition material has a depolymerizability characteristic such that it can be removed by thermal treatment of 250 to 450 degrees Celsius and such that it is stable from 150 to 215 degrees Celsius, and the removal of the cores is performed at a temperature to remove the cores by the thermal treatment.

6. The method of claim 1, wherein a rate for the removing is controlled by adjusting at least one of temperature or pressure for a processing chamber within which substrate is being processed.

7. The method of claim 1, wherein the thermal decomposition material comprises at least one of urethane, polymethyl methacrylate (PMMA), or a monomer.

8. The method of claim 1, wherein the material layer is a hard mask layer.

9. The method of claim 8, wherein a gouging target for the hard mask layer is achieved.

10. The method of claim 1, wherein:
    during depositing of the spacer material, the spacer material is deposited on the material layer; and removal of the cores by the thermal treatment exposes the material layer at locations between the spacers while suppressing gouging of the material layer at locations between the spacers.

11. The method of claim 10, wherein the cores are formed by etching of the layer of the thermal decomposition material prior to depositing of the spacer material; and during etching of the spacer material, the material layer is exposed at locations other than locations of the cores and spacers.

12. The method of claim 1, wherein etching of the spacer material and exposing of top portions of the cores is performed at a temperature at which the thermal decomposition material is stable, and thereafter during removal of the cores in the thermal treatment the cores are exposed to a temperature to remove the cores.

13. The method of claim 1, wherein an anti-reflective coating is formed over the thermal decomposition material prior to depositing of the spacer material, and the exposing of the top portions of the cores further includes removing the anti-reflective coating, and wherein the exposing of the top portions of the cores is performed at a temperature at which the thermal decomposition material is stable, and the thermal treatment is performed at a temperature which removes the cores.

14. A method to improve etch uniformity for processing of microelectronic workpieces, comprising:

providing a substrate with a material layer;

forming cores and spacers on the material layer with two spacers adjacent each core as part of a self-aligned multi-patterning (SAMP) process, the forming comprising forming a layer of a thermal decomposition material; and removing the cores to leave the spacers, the removing including removing the thermal decomposition material with a thermal treatment, wherein the thermal decomposition material comprises an ashing-less coating (ALC) material.

15. The method of claim 14, wherein the ALC material comprises a urea binding resin.

16. The method of claim 15, wherein the urea binding resin comprises polyurea having depolymerizability characteristics such that it can be removed by thermal treatment of less than 450° C.

17. A method to improve etch uniformity for processing of microelectronic workpieces, comprising:

providing a substrate with a material layer;

forming cores and spacers on the material layer with two spacers adjacent each core as part of a self-aligned multi-patterning (SAMP) process, the forming comprising forming a layer of a thermal decomposition material;

removing the cores to leave the spacers, the removing including removing the thermal decomposition material with a thermal treatment, wherein the layer of thermal decomposition material is used as gap fill material for the removing, wherein the forming comprises:
(i) forming a core material layer over the material layer;
(ii) patterning the core material layer to form cores on the material layer;
(iii) depositing a spacer layer over the cores; and
(iv) performing an etch back of the spacer layer to leave spacers as side wall structures adjacent the cores, wherein the removing comprises:
(i) forming a layer of thermal decomposition material over the cores and spacers;
(ii) performing an etch back of the layer of thermal decomposition material using a thermal treatment to expose the cores and to leave the thermal decomposition material as the gap fill material between the cores and spacers;
(iii) performing a mandrel pull process to remove the cores; and
(iv) applying the thermal treatment to remove the thermal decomposition material;

wherein steps after the forming the layer of the thermal decomposition material and prior to applying the thermal treatment are performed at a temperature at which the thermal decomposition material is stable, and the thermal treatment is performed at a temperature at which the thermal decomposition material is removed, and the thermal decomposition material is an ashing-less coating (ALC) material.

18. The method of claim 17, wherein the material layer is a hard mask layer.

19. The method of claim 18, wherein a gouging target for the hard mask layer is achieved.

* * * * *